(12) United States Patent
Lin

(10) Patent No.: US 11,637,202 B2
(45) Date of Patent: Apr. 25, 2023

(54) METHOD FOR FABRICATING SEMICONDUCTOR DEVICE WITH PROGRAMMABLE ELEMENT

(71) Applicant: NANYA TECHNOLOGY CORPORATION, New Taipei (TW)

(72) Inventor: Chang-Chieh Lin, Mailiao Township (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/522,068

(22) Filed: Nov. 9, 2021

(65) Prior Publication Data

US 2022/0069126 A1 Mar. 3, 2022

Related U.S. Application Data

(62) Division of application No. 16/984,911, filed on Aug. 4, 2020, now Pat. No. 11,282,960.

(51) Int. Cl.
*H01L 29/78* (2006.01)
*H01L 23/525* (2006.01)
*H01L 29/68* (2006.01)
*H01L 29/66* (2006.01)
*H01L 29/10* (2006.01)

(52) U.S. Cl.
CPC ...... *H01L 29/7838* (2013.01); *H01L 23/5252* (2013.01); *H01L 29/1037* (2013.01); *H01L 29/66568* (2013.01); *H01L 29/685* (2013.01)

(58) Field of Classification Search
CPC .......................... H01L 29/7838; H01L 23/5252
See application file for complete search history.

(56) References Cited

U.S. PATENT DOCUMENTS

| 5,134,457 A * | 7/1992 | Hamdy | H01L 23/5252 257/530 |
| 11,282,960 B2* | 3/2022 | Lin | H01L 29/1037 |
| 2002/0094611 A1 | 7/2002 | Wu et al. | |
| 2017/0047285 A1 | 2/2017 | Cheng et al. | |
| 2019/0019803 A1 | 1/2019 | Cheng et al. | |
| 2021/0391342 A1* | 12/2021 | Chang | H10B 20/20 |

FOREIGN PATENT DOCUMENTS

TW 201810616 A 3/2018

OTHER PUBLICATIONS

Office Action dated Mar. 14, 2022 related to Taiwanese Application No. 110116916.

* cited by examiner

*Primary Examiner* — Wasiul Haider
(74) *Attorney, Agent, or Firm* — Xuan Zhang

(57) ABSTRACT

The present application discloses a method for fabricating a semiconductor device The method includes providing a substrate; forming a channel region in the substrate; forming a gate dielectric layer on the channel region; forming a gate bottom conductive layer on the gate dielectric layer; forming first impurity regions on two ends of the channel region; forming first contacts on the first impurity regions; forming programmable insulating layers on the first contacts; forming a gate via on the gate bottom conductive layer; and forming a top conductive layer on the gate via and the programmable insulating layers.

11 Claims, 19 Drawing Sheets

METHOD FOR FABRICATING SEMICONDUCTOR DEVICE WITH PROGRAMMABLE ELEMENT

CROSS-REFERENCE TO RELATED APPLICATION

This application is a divisional application of U.S. Non-Provisional application Ser. No. 16/984,911 filed Aug. 4, 2020, which is incorporated herein by reference in its entirety.

TECHNICAL FIELD

The present disclosure relates to a method for fabricating a semiconductor device, and more particularly, to a method for fabricating a semiconductor device with the programmable feature.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a channel region positioned in the substrate, first impurity regions positioned in the substrate and respectively positioned on two ends of the channel region, a gate dielectric layer positioned on the channel region, a gate bottom conductive layer positioned on the gate dielectric layer, first contacts respectively positioned on the first impurity regions, programmable insulating layers respectively positioned on the first contacts, a top conductive layer positioned on the programmable insulating layers and electrically coupled to the gate bottom conductive layer.

In some embodiments, thicknesses of the programmable insulating layers are different from a thickness of the gate dielectric layer.

In some embodiments, the gate dielectric layer has a same thickness as the programmable insulating layers.

In some embodiments, the semiconductor device includes a gate top conductive layer positioned on the gate bottom conductive layer and electrically coupled to the top conductive layer. The gate top conductive layer is formed of titanium silicide, nickel silicide, nickel platinum silicide, tantalum silicide, or cobalt silicide.

In some embodiments, a thickness of the gate top conductive layer is between about 2 nm and about 20 nm.

In some embodiments, the semiconductor device includes first gate spacers positioned on sidewalls of the gate dielectric layer and sidewalls of the gate bottom conductive layer.

In some embodiments, the semiconductor device includes second gate spacers positioned on sidewalls of the first gate spacers.

In some embodiments, the semiconductor device includes a peak portion having an triangular cross-sectional profile and positioned between the channel region and the gate dielectric layer. The gate dielectric layer includes a capping portion positioned on the peak portion and flat portions respectively connecting to two ends of the capping portion and positioned on the channel region.

In some embodiments, a thickness of the capping portion is equal to or less than thicknesses of the flat portions.

In some embodiments, the peak portion includes a first faceted plane and a second faceted plane both contacting the capping portion and an angle between the first faceted plane and the second faceted plane is between about 50 degree and about 60 degree.

In some embodiments, the semiconductor device includes a gate via positioned between the top conductive layer and the gate top conductive layer, wherein the top conductive layer and the gate top conductive layer are electrically coupled through the gate via.

In some embodiments, the semiconductor device includes a covering layer covering the first impurity regions, the first gate spacers, and the gate top conductive layer. The first contacts are respectively positioned along the covering layer and respectively positioned on the first impurity regions and the gate via is positioned along the covering layer and positioned on the gate top conductive layer.

In some embodiments, the semiconductor device includes a second impurity region positioned in the substrate and distant from the first impurity regions. The second impurity region has a different electrical type from the first impurity regions and one of the first contacts is electrically coupled to the second impurity region.

Another aspect of the present disclosure provides a semiconductor device including a substrate, a channel region positioned in the substrate, first impurity regions positioned in the substrate and respectively positioned on two ends of the channel region, a gate dielectric layer positioned on the channel region, a gate bottom conductive layer positioned on the gate dielectric layer, a gate via positioned on the gate bottom conductive layer, first contacts respectively positioned on the first impurity regions, programmable insulating layers respectively positioned on the first contacts, top conductive layers respectively positioned on the programmable insulating layers and the gate via.

Another aspect of the present disclosure provides a method for fabricating a semiconductor device including providing a substrate, forming a channel region in the substrate, forming a gate dielectric layer on the channel region, forming a gate bottom conductive layer on the gate dielectric layer, forming first impurity regions on two ends of the channel region, forming first contacts on the first impurity regions, forming programmable insulating layers on the first contacts, forming a gate via on the gate bottom conductive layer, and forming a top conductive layer on the gate via and the programmable insulating layers.

In some embodiments, the method for fabricating the semiconductor device includes a step of forming first gate spacers on sidewalls of the gate bottom conductive layer and sidewalls of the gate dielectric layer.

In some embodiments, the method for fabricating the semiconductor device includes a step of forming a gate top conductive layer between the gate via and the gate bottom conductive layer.

In some embodiments, the gate top conductive layer is formed of titanium silicide, nickel silicide, nickel platinum silicide, tantalum silicide, or cobalt silicide.

In some embodiments, a dopant concentration of the channel region is less than a dopant concentration of the first impurity regions.

In some embodiments, the channel region and the substrate have different electrical types.

Due to the design of the semiconductor device of the present disclosure, the gate dielectric layer and/or the programmable insulating layers may be rupture when a programming voltage is applied. Therefore, the semiconductor device may serve as a programmable element and may be used in a repair system of a chip to improve the yield of the chip. In addition, with the presence of the peak portion, the reliability of programming the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
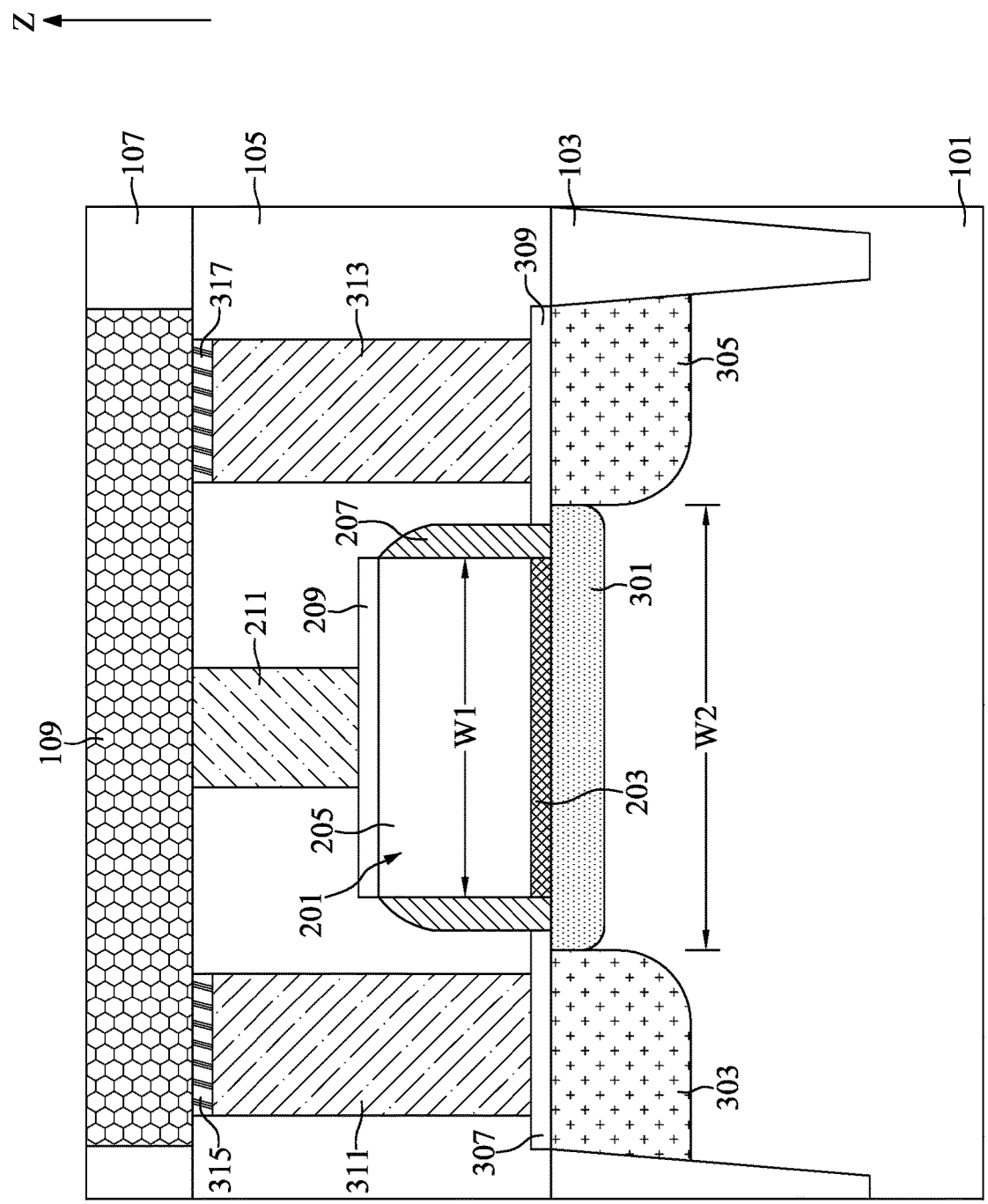
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a "depth" refers to a vertical size of an element (e.g., a layer, trench, hole, opening, etc.) in a cross-sectional perspective measured from a top surface to a bottom surface of the element; a "width" refers to a size of an element (e.g., a layer, trench, hole, opening, etc.) in a cross-sectional perspective measured from a side surface to an opposite surface of the element. The term "thickness" may substitute for "width" and/or "depth" where indicated.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

FIG. 1 illustrates, in a schematic cross-sectional view diagram, a semiconductor device 1A in accordance with one embodiment of the present disclosure.

With reference to FIG. 1, the semiconductor device 1A may include a substrate 101, an isolation layer 103, a first insulating layer 105, a second insulating layer 107, a top conductive layer 109, a gate structure 201, first gate spacers 207, a gate top conductive layer 209, a gate via 211, a channel region 301, first impurity regions 303, 305, first conductive layers 307, 309, first contacts 311, 313, and programmable insulating layers 315, 317.

With reference to FIG. 1, in some embodiments, the substrate 101 may be a bulk semiconductor substrate that is composed entirely of at least one semiconductor material. The semiconductor material that provides the bulk semiconductor substrate may include any material, or stack of materials, having semiconducting properties including, but not limited to, silicon, germanium, silicon germanium alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In some embodiments, the substrate 101 may be doped with a dopant such as phosphorus, arsenic, antimony, or boron. In the embodiment depicted, the substrate 101 is doped with boron and has a first electrical type. In some embodiments, the substrate 101 may include an organic semiconductor or a layered semiconductor such as silicon/silicon germanium, silicon-on-insulator or silicon germanium-on-insulator.

With reference to FIG. 1, the isolation layer 103 may be disposed in the substrate 101. The top surface of the isolation layer 103 may be substantially coplanar with the top surface of the substrate 101. The isolation layer 103 may have an aspect ratio between about 1:4 and about 1:10. In some embodiments, the sidewalls of the isolation layer 103 may be tapered. In some embodiments, the sidewalls of the isolation layer 103 may be substantially vertical. The isolation layer 103 may be formed of, for example, silicon oxide, silicon nitride, silicon oxynitride, silicon nitride oxide, or fluoride-doped silicate.

It should be noted that a surface is "vertical" if there exists a vertical plane from which the surface does not deviate by more than three times the root mean square roughness of the surface.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, the first insulating layer 105 may be disposed on the substrate 101. The second insulating layer 107 may be disposed on the first insulating layer 105. The first insulating layer 105 and the second insulating layer 107 may have thicknesses between about 0.5 micrometer and about 3.0 micrometer. The first insulating layer 105 and the second insulating layer 107 may be formed of, for example, silicon oxide, borophosphosilicate glass, undoped silicate glass, fluorinated silicate glass, low-k dielectric materials, the like, or a combination thereof. The first insulating layer 105 and the second insulating layer 107 may be formed of different materials but are not limited thereto. The low-k dielectric materials may have a dielectric constant less than 3.0 or even less than 2.5. In some embodiments, the low-k dielectric materials may have a dielectric constant less than 2.0.

With reference to FIG. 1, the channel region 301 may be disposed in the substrate 101. The top surface of the channel region 301 may be substantially coplanar with the top surface of the substrate 101. The channel region 301 may be doped with a dopant such as phosphorus, arsenic, antimony, or boron. In the embodiment depicted, the channel region 301 is doped with phosphorus and has a second electrical type. The dopant concentration of the channel region 301 may be greater than the dopant concentration of the substrate 101.

With reference to FIG. 1, the first impurity regions 303, 305 may be disposed in the substrate 101. The first impurity regions 303, 305 may be respectively correspondingly disposed on two ends of the channel region 301. The top surfaces of the first impurity regions 303, 305 may be substantially coplanar with the top surface of the substrate 101. The bottom surfaces of the first impurity regions 303, 305 may be at a vertical level lower than a vertical level of the channel region 301.

The first impurity regions 303, 305 may be doped with a dopant such as phosphorus, arsenic, antimony, or boron. In the embodiment depicted, the first impurity regions 303, 305 are doped with phosphorus and have the second electrical type. The dopant concentration of the first impurity regions 303, 305 may be greater than the dopant concentration of the channel region 301. The first impurity regions 303, 305 and the channel region 301 may be electrically connected. The first impurity regions 303, 305 may be also referred herein to as source/drain regions.

With reference to FIG. 1, the gate structure 201 may be disposed on the channel region 301 and in the first insulating layer 105. The gate structure 201 may include a gate dielectric layer 203 and a gate bottom conductive layer 205.

With reference to FIG. 1, the gate dielectric layer 203 may be disposed on the channel region 301. A width W1 of the gate dielectric layer 203 may be less than a width W2 of the channel region 301. In some embodiments, the gate dielectric layer 203 may be formed of, for example, silicon oxide. In some embodiments, the gate dielectric layer 203 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate dielectric layer 203 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the gate dielectric layer 203 may be a multilayer structure that includes, for example, one layer of silicon oxide and another layer of high-k dielectric material.

In some embodiments, an interfacial layer (Not shown in FIG. 1) may be disposed between the gate dielectric layer 203 and the substrate 101. The interfacial layer may have a thickness between about 7 angstroms and about 12 angstroms. In some embodiments, the interfacial layer may have a thickness between about 8 angstroms and about 10 angstroms. The interfacial layer may facilitate the formation of the gate dielectric layer 203 during fabrication of the semiconductor device 1A.

With reference to FIG. 1, the gate bottom conductive layer 205 may be disposed on the gate dielectric layer 203. In some embodiments, the gate bottom conductive layer 205 may be formed of, for example, a conductive material such as polycrystalline silicon, polycrystalline silicon germanium, or a combination thereof. In some embodiments, the gate bottom conductive layer 205 may be doped with a dopant such as phosphorus, arsenic, antimony, or boron. In some embodiments, the gate bottom conductive layer 205 may be formed of, for example, tungsten, aluminum, titanium, copper, the like, or a combination thereof. The composition of the gate structure 201, the channel region 301, and the first impurity regions 303, 305 may be referred to as a depletion mode transistor.

In some embodiments, the gate dielectric layer 203 and the gate bottom conductive layer 205 may have an U-shaped cross-sectional profile and may be suitable to integrate in a gate last or gate first process flow.

With reference to FIG. 1, the first gate spacers 207 may be disposed on the sidewalls of the gate bottom conductive layer 205 and the sidewalls of the gate dielectric layer 203. The first gate spacers 207 may be also disposed on the channel region 301. The first gate spacers 207 may be formed of, for example, silicon oxide, silicon nitride, or the like.

With reference to FIG. 1, the gate top conductive layer 209 may be disposed on the gate bottom conductive layer 205 and in the first insulating layer 105. The gate top conductive layer 209 may have a thickness between about 2 nm and about 20 nm. The gate top conductive layer 209 may be formed of, for example, titanium silicide, nickel silicide, nickel platinum silicide, tantalum silicide, or cobalt silicide.

With reference to FIG. 1, the first conductive layers 307, 309 may be respectively correspondingly disposed on the first impurity regions 303, 305. The first conductive layers 307, 309 may have same thicknesses as the gate top conductive layer 209. The first conductive layers 307, 309 may be formed of a same material as the gate top conductive layer 209. The gate top conductive layer 209 and the first conductive layers 307, 309 may be employed as ohmic contacts.

With reference to FIG. 1, the gate via 211 may be disposed on the gate top conductive layer 209 and in the first insulating layer 105. The top surface of the gate via 211 may be substantially coplanar with the top surface of the first insulating layer 105. The gate via 211 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The gate via 211 may be electrically connected to the gate top conductive layer 209.

With reference to FIG. 1, the first contacts 311, 313 may be respectively correspondingly disposed on the first conductive layers 307, 309. The first contacts 311, 313 may be disposed in the first insulating layer 105. The thickness of first contacts 311, 313 may be less than the thickness of the first insulating layer 105. The first contacts 311, 313 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The first contacts 311, 313 may be electrically connected to the first impurity regions 303, 305, respectively.

With reference to FIG. 1, the programmable insulating layers 315, 317 may be respectively correspondingly disposed on the first contacts 311, 313. The programmable insulating layers 315, 317 may be disposed in the first insulating layer 105. The top surfaces of the programmable insulating layers 315, 317 may be substantially coplanar with the top surface of the gate via 211. In some embodiments, the programmable insulating layers 315, 317 may have a same thickness. In some embodiments, the programmable insulating layers 315, 317 may have different thicknesses. In some embodiments, the gate dielectric layer 203 and the programmable insulating layers 315, 317 may have a same thickness. In some embodiments, the gate dielectric layer 203 and the programmable insulating layers 315, 317 may have different thicknesses. The thicknesses of the gate via 211 and the programmable insulating layers 315, 317 may determine the programming current or programming voltage thereof during a programming procedure.

In some embodiments, the programmable insulating layers 315, 317 may be formed of a same material as the gate dielectric layer 203. In some embodiments, the programmable insulating layers 315, 317 may be formed of a different material from the gate dielectric layer 203. For example, the programmable insulating layers 315, 317 may be formed of silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof. The programmable insulating layers 315, 317 may be formed of a same material but are not limited thereto.

With reference to FIG. 1, the top conductive layer 109 may be disposed in the second insulating layer 107. The top conductive layer 109 may be disposed on the gate via 211 and the programmable insulating layers 315, 317. The top conductive layer 109 may be electrically connected to the gate via 211. In some embodiments, the top conductive layer 109 may be formed of a same material as the first contacts 311, 313. In some embodiments, the top conductive layer 109 may be formed of a different material from the first contacts 311, 313. For example, the top conductive layer 109 may be formed of tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

The composition of the top conductive layer 109, the programmable insulating layer 315, the first contact 311 may be referred to as a source capacitor. The composition of the top conductive layer 109, the programmable insulating layer 317, the first contact 313 may be referred to as a drain capacitor. It should be noted that, in the description of the present disclosure, source and drain may be used interchangeably. The composition of the top conductive layer 109, the gate via 211, the gate structure 201, and the channel region 301 may be referred to as a gate capacitor. The source capacitor, the drain capacitor, and the gate capacitor may serve as programmable elements such as anti-fuses.

During a programming procedure of the semiconductor device 1A, a programming voltage may be provided and applied to the semiconductor device 1A through, for example, the top conductive layer 109 and the substrate 101. After a given programming time, the high voltage stress originated from the programming voltage may induce the rupture or breakdown of the gate dielectric layer 203 and/or the programmable insulating layers 315, 317. The conductive states of the source capacitor, the drain capacitor, and the gate capacitor may be turned from an "off" state into an "on" state after the programming procedure. In some embodiments, all the gate dielectric layer 203 and the programmable insulating layers 315, 317 may be ruptured after the programming procedure. In some embodiments, only two of the gate dielectric layer 203 and the programmable insulating layers 315, 317 may be ruptured after the programming procedure. In some embodiments, only one of the gate dielectric layer 203 and the programmable insulating layers 315, 317 may be ruptured after the programming procedure.

Figure 2:
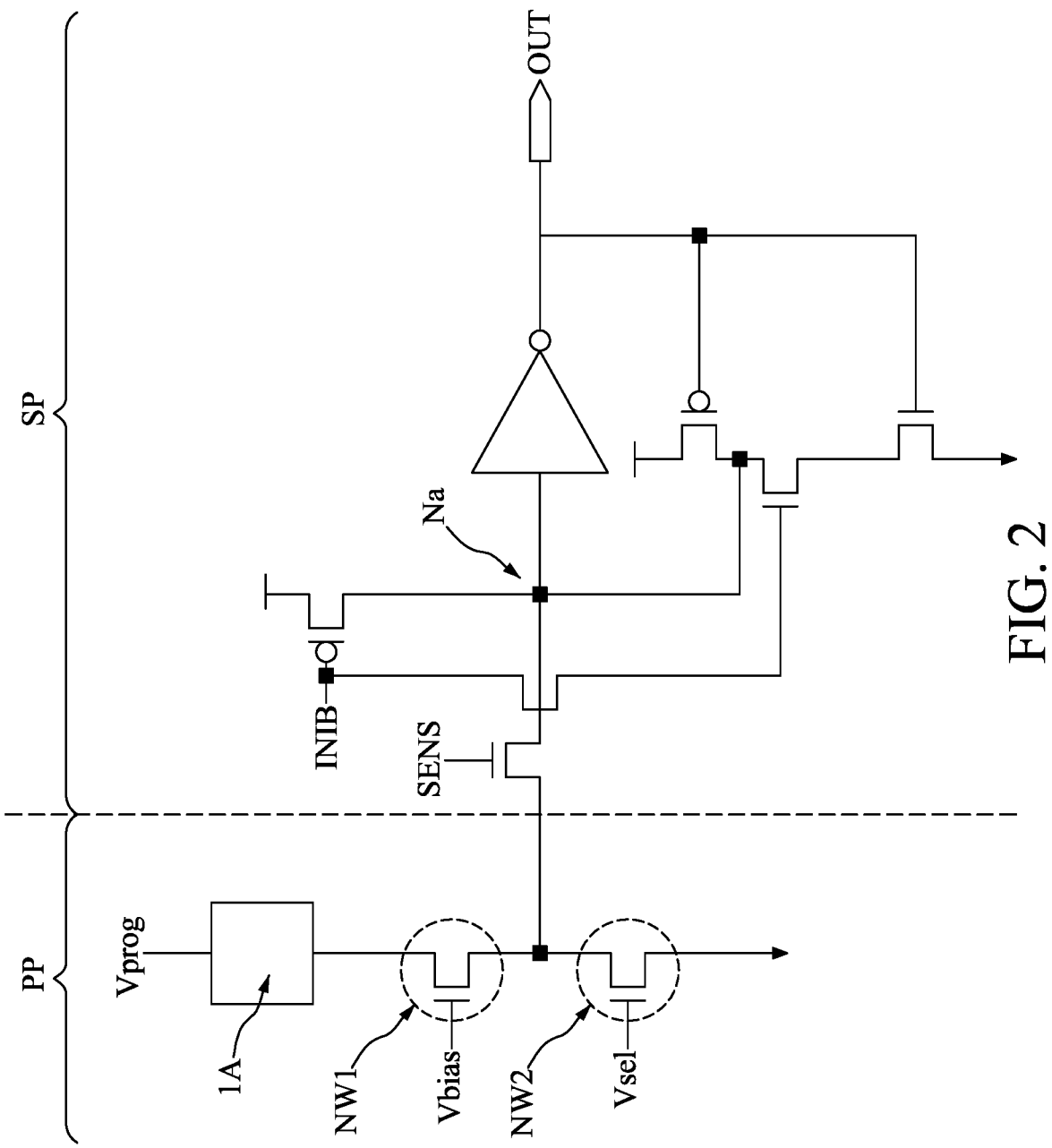
FIG. 2 illustrate a schematic circuit diagram having the semiconductor device in accordance with one embodiment of the present disclosure.

FIG. 2 illustrate a schematic circuit diagram having the semiconductor device 1A in accordance with one embodiment of the present disclosure.

In some embodiments, the semiconductor device 1A as a whole may be serve as a programmable element and may integrate with other semiconductor elements. With reference to FIG. 2, the exemplificative circuit may include a programming part PP and a sensing part SP. The programming part PP may be composed by the semiconductor device 1A in series with a high voltage block switch NW1 and a current limit switch NW2. The series of the semiconductor device 1A, the high voltage block switch NW1, and the current limit switch NW2 may prevent the contact burnt problem due to the programming overstress.

While programming the programming part PP, a programming voltage Vprog may be applied to the top conductive layer 109 (Not shown in FIG. 2 for clarity) of the semiconductor device 1A and a selection voltage Vsel may be applied to the gate node of the current limit switch NW2. After a given programming time, the high voltage stress originated from the programming voltage Vprog may induce the rupture or breakdown of the gate dielectric layer 203 (Not shown in FIG. 2 for clarity) and/or the programmable insulating layers 315, 317 (Not shown in FIG. 2 for clarity) of the semiconductor device 1A. The selection voltage Vsel, which may limit the maximum current during programming, may be applied to prevent the contact from being burnt by the excessive programming current. The high voltage block switch NW1 may be inserted between the semiconductor device 1A and the sensing part SP to decouple the sensing part SP from the high electric field while programming. The bias voltage Vbias applied to the gate node of the high voltage block switch NW1 may be set to half value of the programming voltage Vprog.

The sensing part SP may turn on during power up and may detect whether the state of the semiconductor device 1A is in rupture or not. If the semiconductor device 1A is intact (i.e., no rupture), during power up, a pulse signal INIB, which is used to initialize the latch during power up, may be activated to "LOW" and the first Node Na may be initialized to "High". Because both the selection voltage Vsel and the programming voltage Vprog are at ground, the state of the semiconductor device 1A may be sensed to the first Node Na when a sensing transistor SENS is activated to "High". If the semiconductor device 1A is in rupture, a current path from the first Node Na to ground (Vprog) may be formed. Therefore, the state of the first Node Na may turn to "LOW." Otherwise, the first Node Na may stay in the precharged state of "High."

It should be noted that the same or similar reference numbers used throughout the drawings are used to denote the same or similar features, elements, or structures, and thus, a detailed explanation of the same or similar features, elements, or structures will not be repeated for each of the drawings.

FIGS. 3 to 7 illustrate, in schematic cross-sectional view diagrams, semiconductor devices 1B, 1C, 1D, 1E, and 1F in accordance with some embodiments of the present disclosure.

Figure 3:
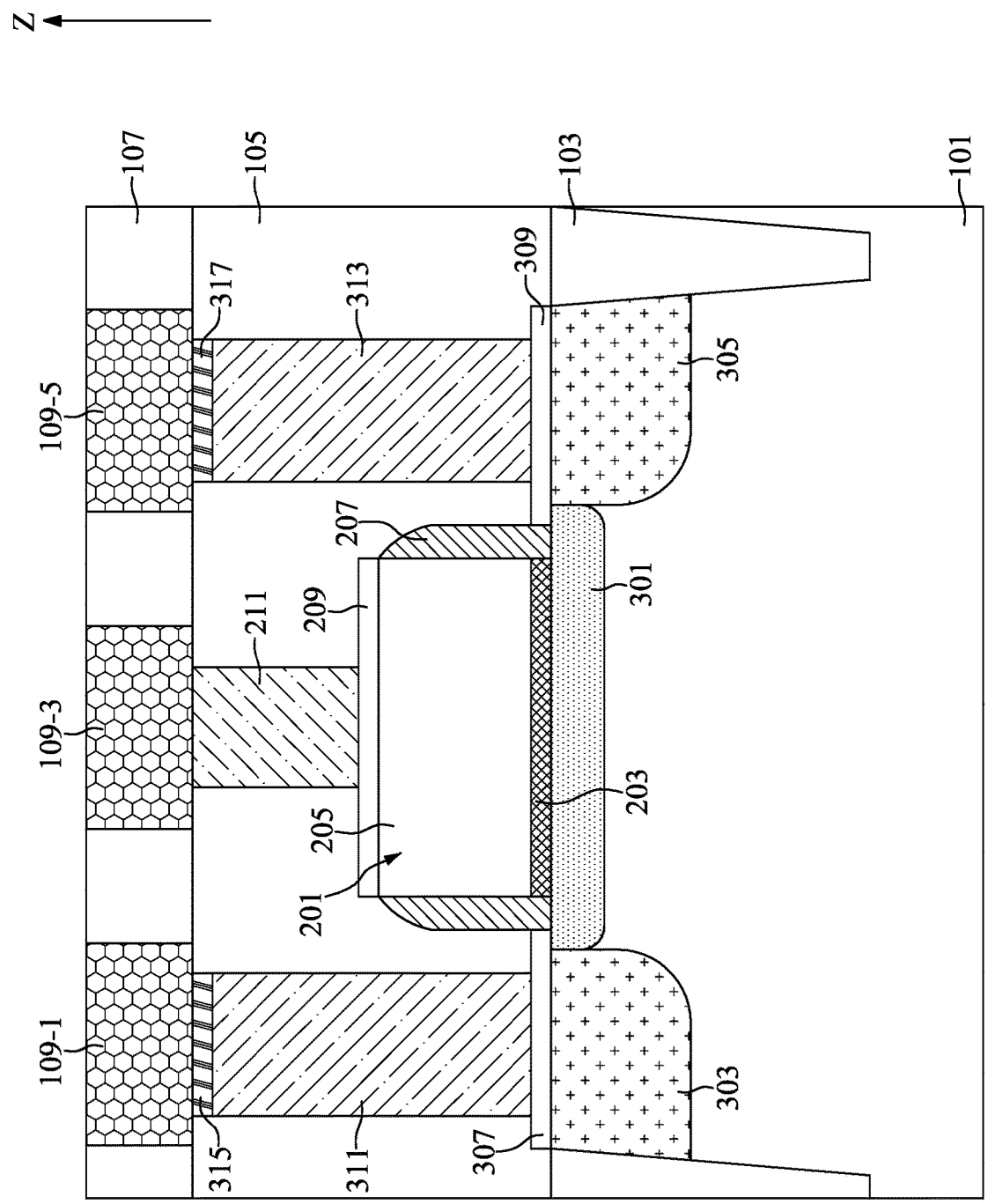
FIGS. 3 to 7 illustrate, in schematic cross-sectional view diagrams, semiconductor devices in accordance with some embodiments of the present disclosure.

With reference to FIG. 3, in the semiconductor device 1B, top conductive layers 109-1, 109-3, 109-5 may be respectively correspondingly disposed on the gate via 211 and the programmable insulating layers 315, 317. The top conductive layers 109-1, 109-3, 109-5 may be electrically coupled to different external voltage sources. The programming procedure of the source capacitor, the drain capacitor, and the gate capacitor may be separately performed with the assistant of the top conductive layers 109-1, 109-3, 109-5. Only one, which depends on the top conductive layers 109-1, 109-3, 109-5 used, of the gate dielectric layer 203 and the programmable insulating layers 315, 317 may be ruptured after each programming procedure.

Figure 4:
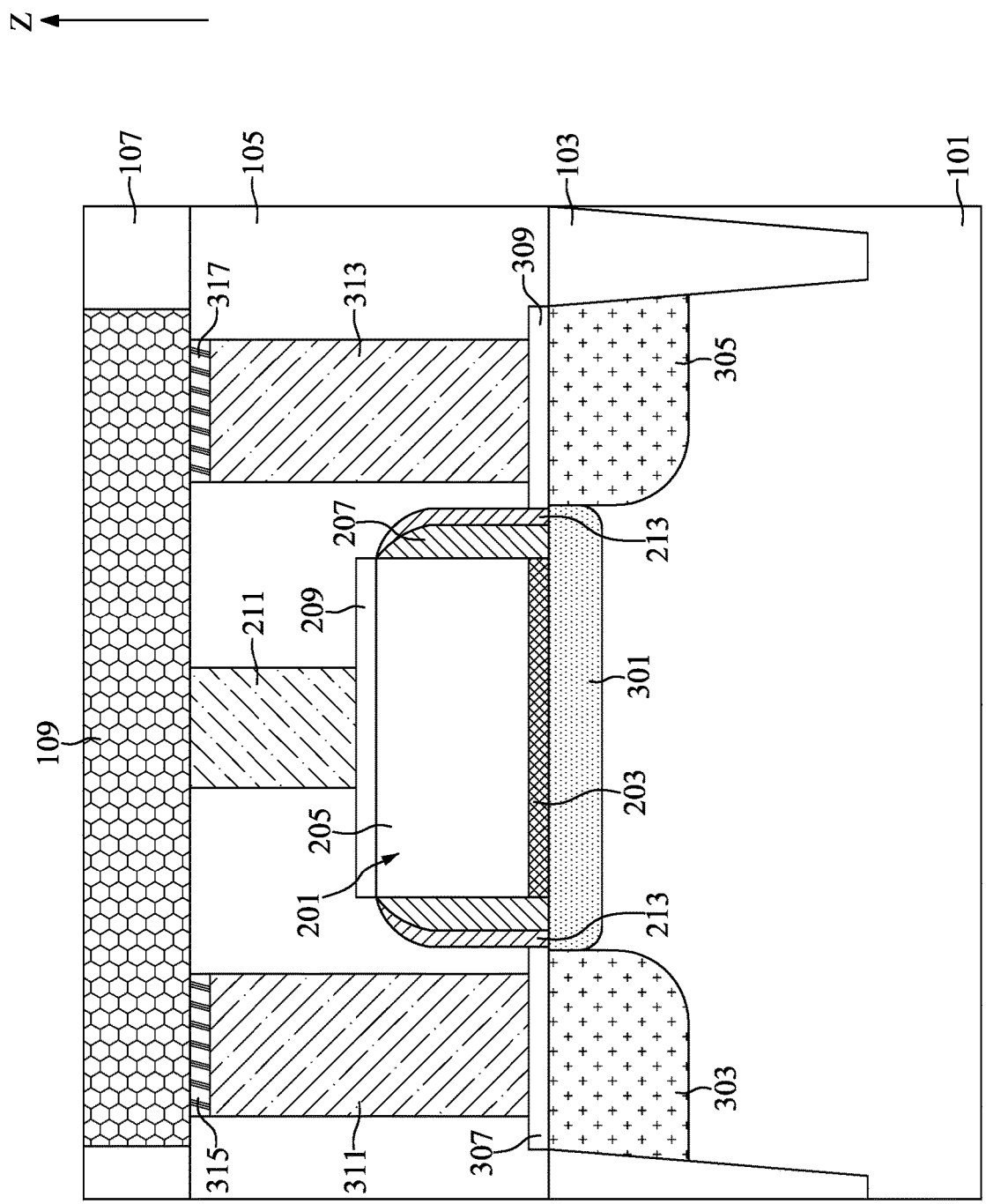

With reference to FIG. 4, in the semiconductor device 1C, second gate spacers 213 may be disposed on the sidewalls of the first gate spacers 207. The first gate spacers 207 may be formed of, for example, silicon oxide, silicon nitride, or polysilicon. The second gate spacers 213 may be formed of, for example, silicon oxide. Due to the presence of the second gate spacers 213, a thickness of the first gate spacers 207 may be minimized, thereby reducing overlap capacitance formed between the gate bottom conductive layer 205 and the first impurity regions 303, 305.

Figure 5:
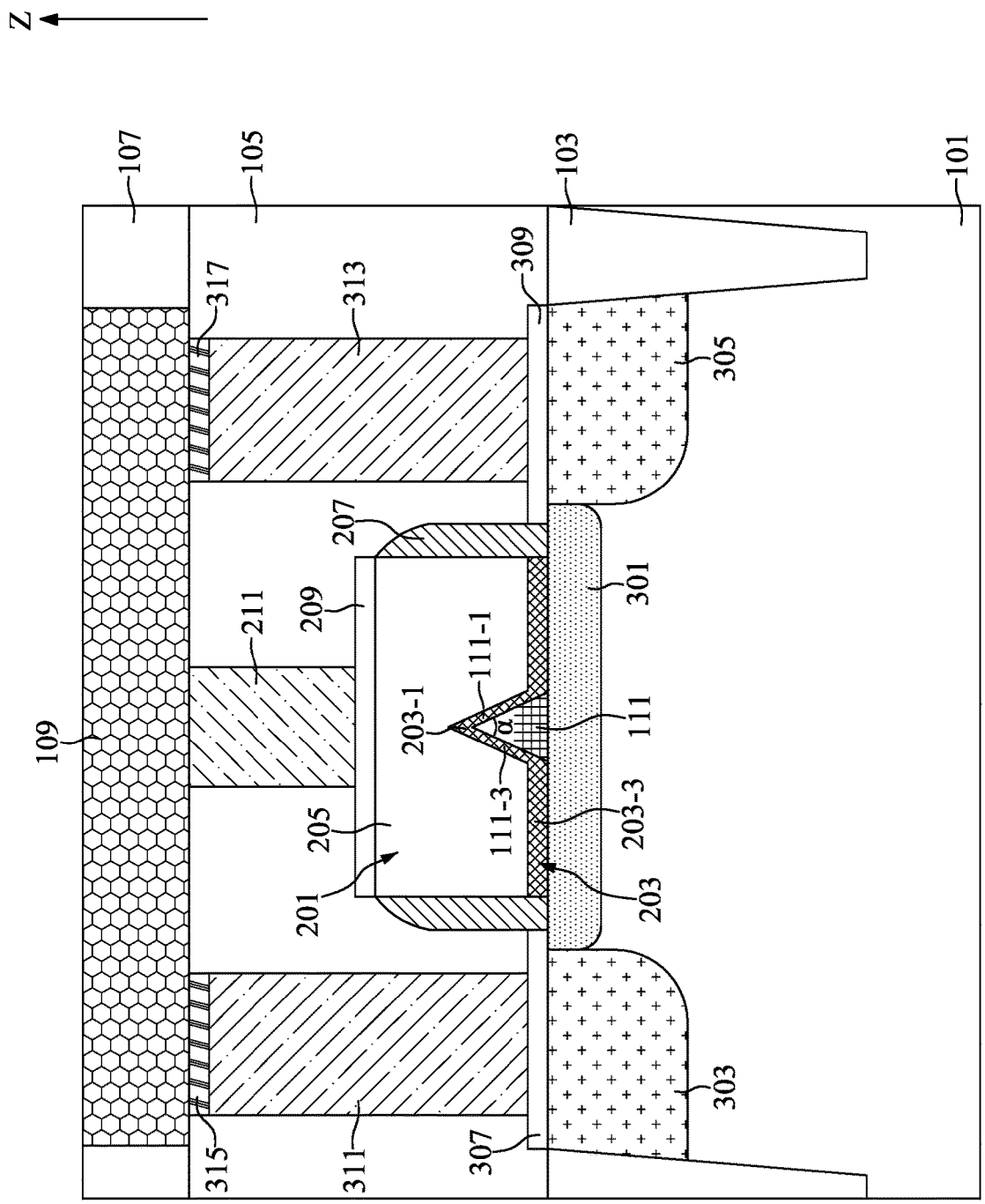

With reference to FIG. 5, in the semiconductor device 1D, a peak portion 111 may be disposed between the channel region 301 and gate dielectric layer 203. The peak portion 111 may have a cross-sectional profile which is a triangular shape and may include a first faceted plane 111-1 and a second faceted plane 111-3 intersecting to each other. An angle α between the first faceted plane 111-1 and the second faceted plane 111-3 may be between about 50 degree and about 60 degree. The first faceted plane 111-1 and the second faceted plane 111-3 may have a crystal orientation <111>. In some embodiments, the peak portion 111 may have cross-sectional profile which is a diamond shape, a pentagonal shape, or a shape having more than five sides. The peak portion 111 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIG. 5, the gate dielectric layer 203 may be disposed on the peak portion 111 and the channel region 301. The gate dielectric layer 203 may include a capping portion 203-1 and two flat portions 203-3. The capping portion 203-1 may be disposed on the first faceted plane 111-1 and the second faceted plane 111-3. The two flat portions 203-3 may be respectively correspondingly connected to two ends of the capping portion 203-1. The two flat portions 203-3 may be disposed on the channel region 301. A thickness of the two flat portions 203-3 may be greater than or equal to a thickness of the capping portion 203-1. In some embodiments, the thickness of the two flat portions 203-3 may be greater than the thickness of the capping portion 203-1.

During programming of the semiconductor device 1D, the vertex of the peak portion 111 may be the most vulnerable part because electrical fields concentrate at the sharp profile. Since the vertex of the peak portion 111 may obtain the highest electrical fields, the capping portion 203-1 may be broken down to form a rupture point of the capping portion 203-1 adjacent to the vertex of the peak portion 111 and a resistance reduction may be induced accordingly. Consequently, the semiconductor device 1D is blown and programmed. The position of the rupture point of the capping portion 203-1 may be easily limited in the place adjacent to the vertex of the peak portion 111 having the highest electrical fields during programming. As result, the reliability of programming of the semiconductor device 1D may be increased.

Figure 6:
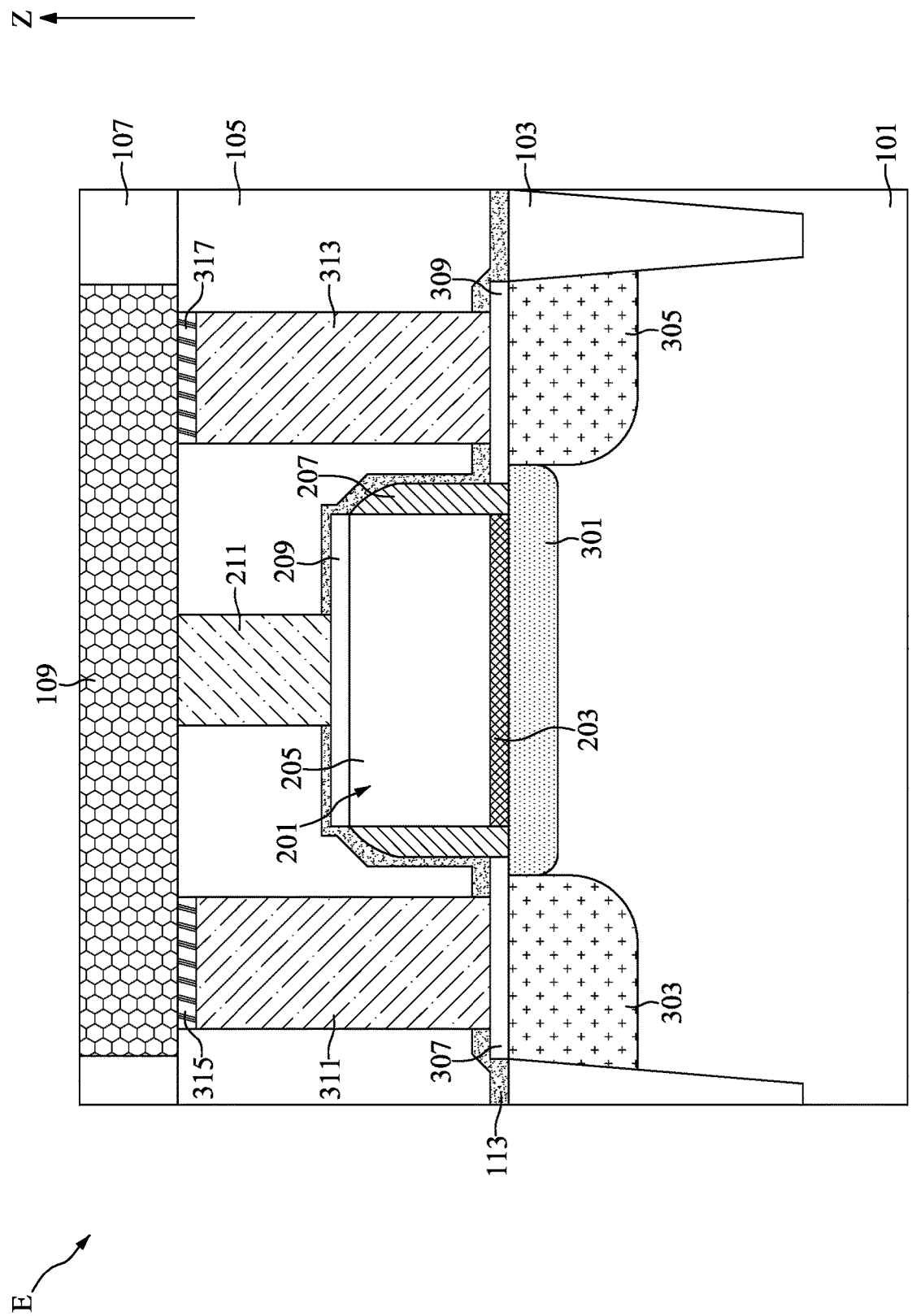

With reference to FIG. 6, in the semiconductor device 1E, a covering layer 113 may be disposed covering the substrate 101, the first conductive layers 307, 309, the first gate spacers 207, and the gate top conductive layer 209. The covering layer 113 may be formed of, for example, silicon nitride. The first contacts 311, 313 may disposed along the covering layer 113 and disposed on the first conductive layers 307, 309, respectively. The covering layer 113 may provide additional protection to the aforementioned elements during subsequent semiconductor processes.

Figure 7:
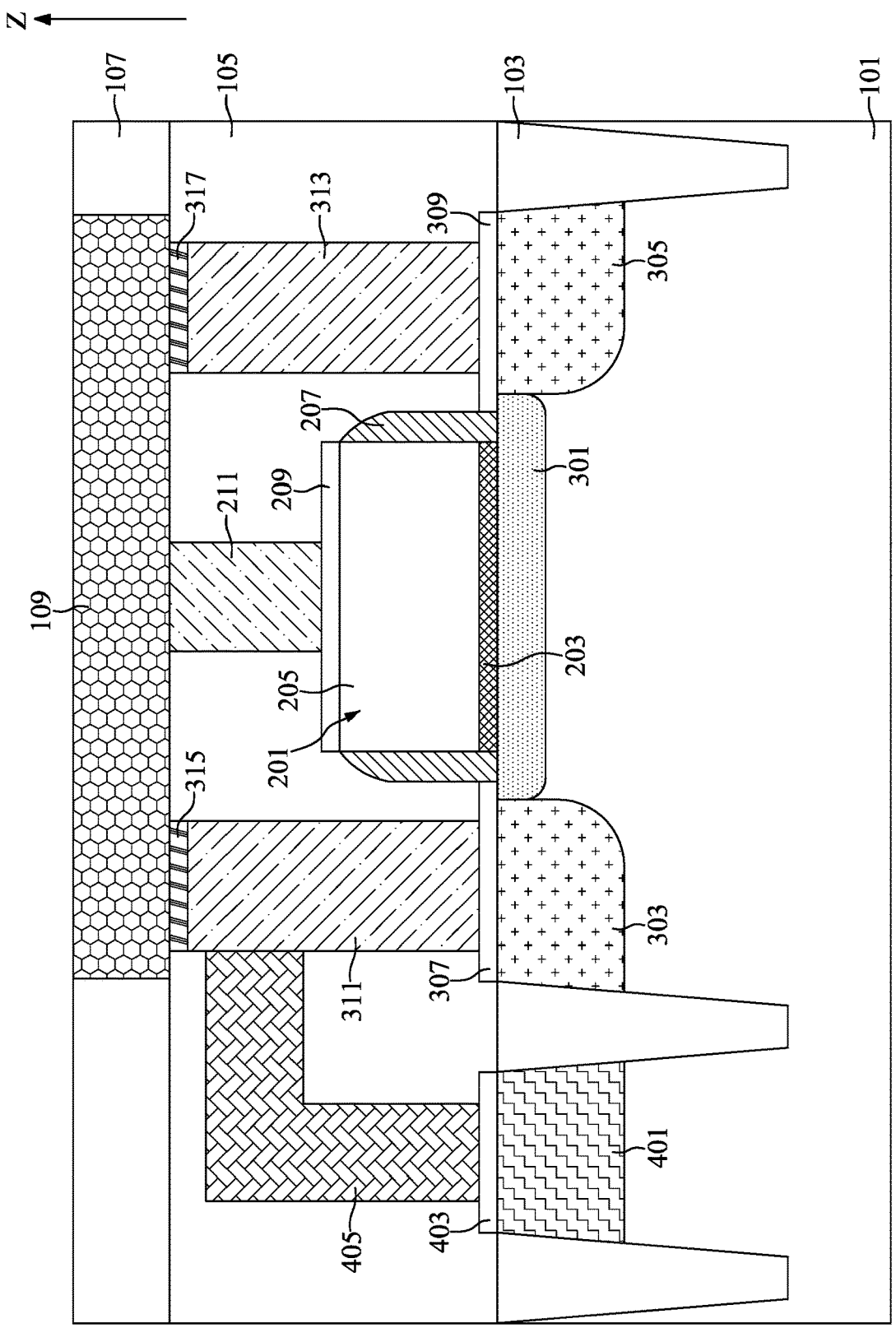

With reference to FIG. 7, in the semiconductor device 1F, the isolation layer 103 may define a first active area 501 and a second active area 503 in the substrate 101. The channel region 301 and the first impurity regions 303, 305 may be disposed in the first active area 501. A second impurity region 401 may be disposed in the second active area 503. The second impurity region 401 may be doped with a dopant such as phosphorus, arsenic, antimony, or boron. In the embodiment depicted, the second impurity region 401 is doped with boron and has the first electrical type which is opposite to the first impurity regions 303, 305. A second conductive layer 403 may be disposed on the second impurity region 401. The second conductive layer 403 may have a same thickness as the gate top conductive layer 209. The second conductive layer 403 may be formed of a same material as the gate top conductive layer 209. A third conductive layer 405 may be disposed on the second conductive layer 403 and may be electrically coupled to the first contact 311. The third conductive layer 405 may be formed of a same material as the first contacts 311, 313.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 8:
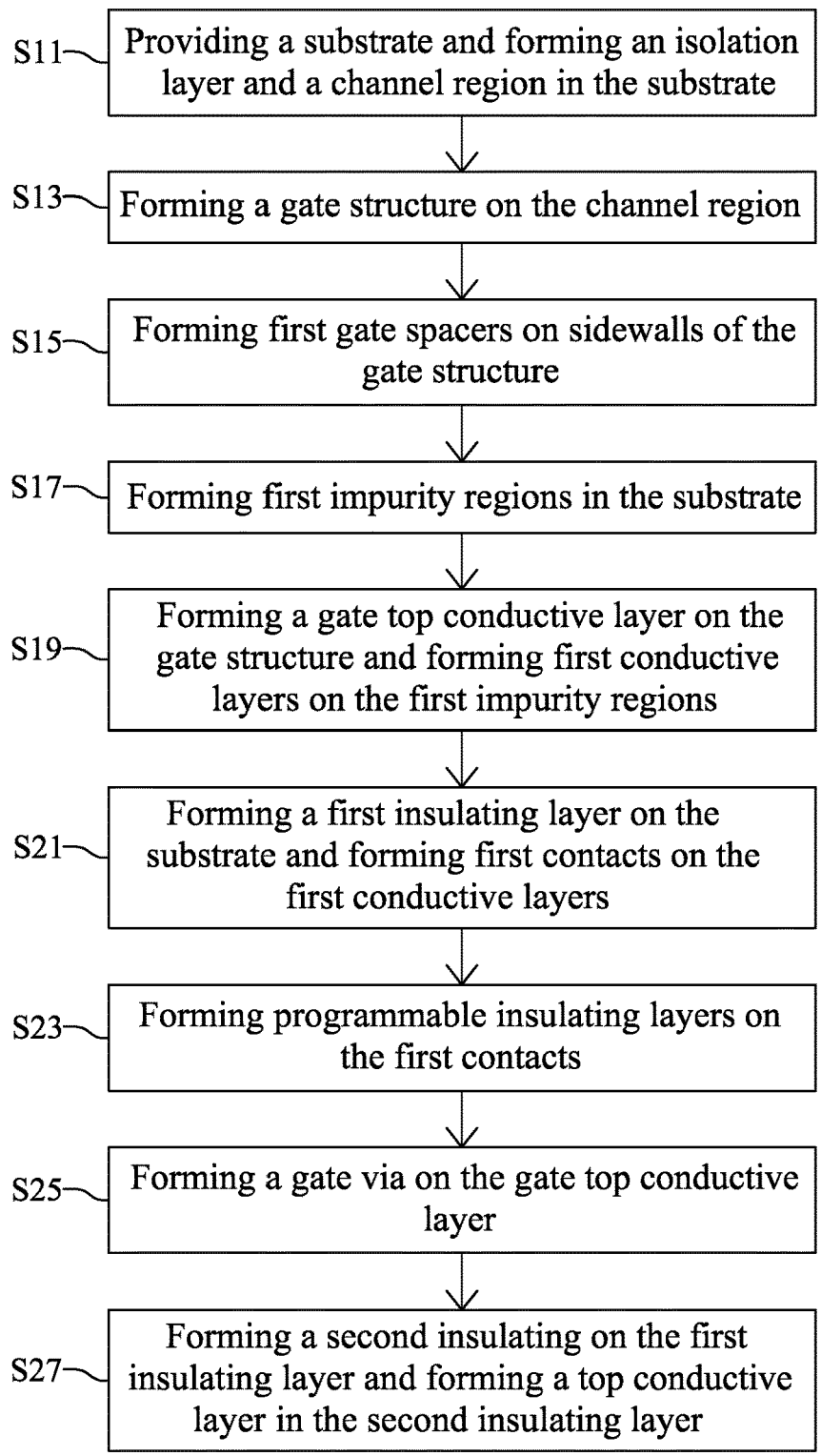
FIG. 8 illustrates, in a flowchart diagram form, a method for fabricating a semiconductor device in accordance with one embodiment of the present disclosure.

FIG. 8 illustrates, in a flowchart diagram form, a method 10 for fabricating a semiconductor device 1A in accordance with one embodiment of the present disclosure. FIGS. 9 to 19 illustrate, in schematic cross-sectional view diagrams, a flow for fabricating the semiconductor device 1A in accordance with one embodiment of the present disclosure.

Figure 9:
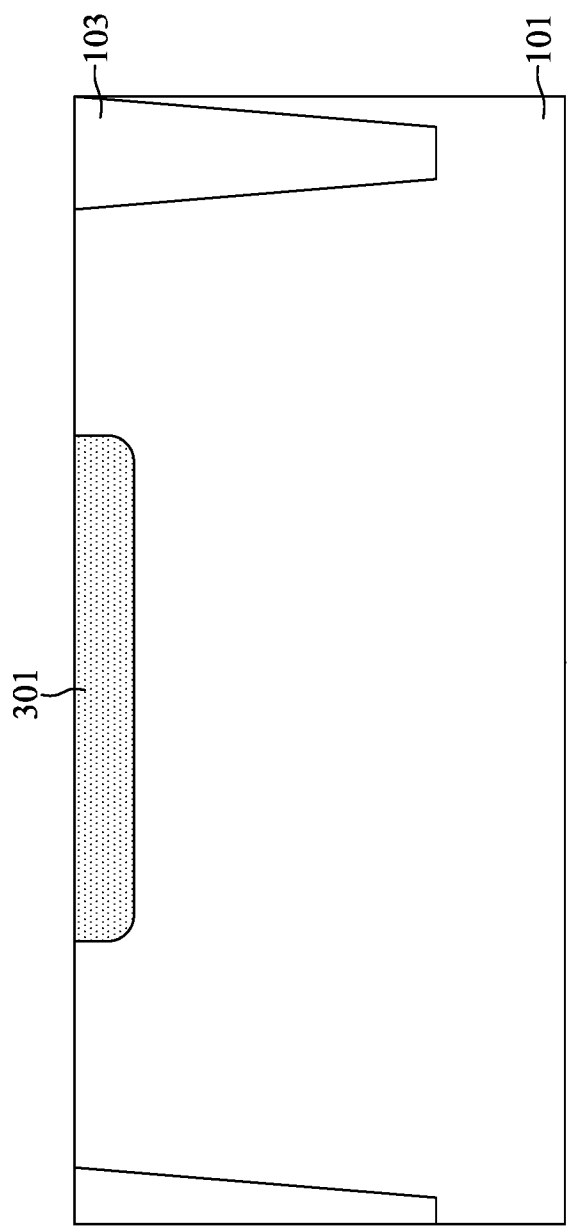
FIGS. 9 to 19 illustrate, in schematic cross-sectional view diagrams, a flow for fabricating the semiconductor device in accordance with one embodiment of the present disclosure.

With reference to FIGS. 8 and 9, at step S11, a substrate 101 may be provided and an isolation layer 103 and a channel region 301 may be formed in the substrate 101.

With reference to FIG. 9, a series of deposition processes may be performed to deposit a pad oxide layer (not shown in FIG. 9) and a pad nitride layer (not shown in FIG. 9) on the substrate 101. A photolithography process may be performed to define positions of the isolation layer 103. After the photolithography process, an etch process, such as an anisotropic dry etch process, may be performed to form trenches along the pad oxide layer, the pad nitride layer, and the substrate 101. An insulating material may be deposited into the trenches. A planarization process, such as chemical mechanical polishing, may be performed to remove excess filling material until the top surface of the substrate 101 is exposed. Subsequently, another photolithography-etch process may be performed to define the position of the channel region 301. An implantation process may be performed to form the channel region 301 in the substrate 101.

Figure 10:
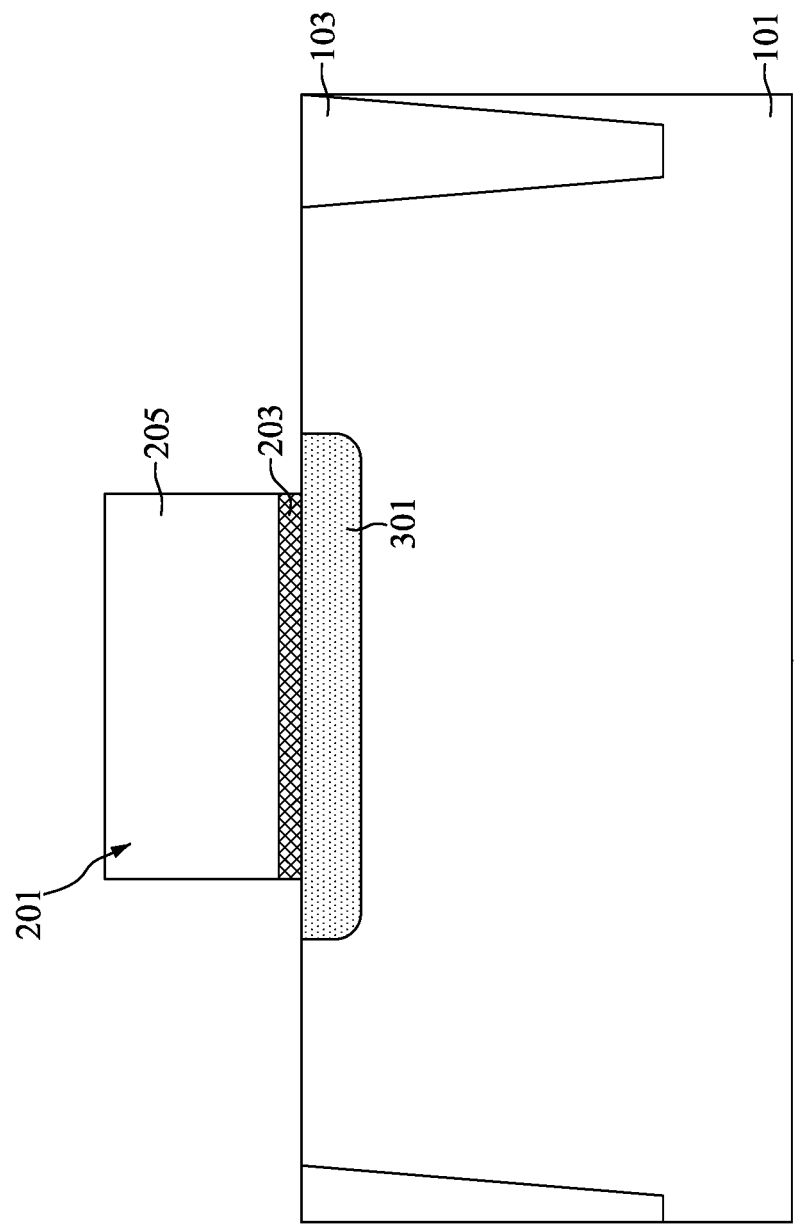

With reference to FIGS. 8 and 10, at step S13, a gate structure 201 may be formed on the channel region 301.

With reference to FIG. 10, the gate structure 201 may include a gate dielectric layer 203 and a gate bottom conductive layer 205. The gate dielectric layer 203 may be formed on the channel region 301. The gate bottom conductive layer 205 may be formed on the gate dielectric layer 203. The gate dielectric layer 203 and the gate bottom conductive layer 205 may be formed by deposition processes and a subsequent photolithography-etch process. The deposition processes may be, for example, chemical vapor deposition or atomic layer deposition.

Figure 11:
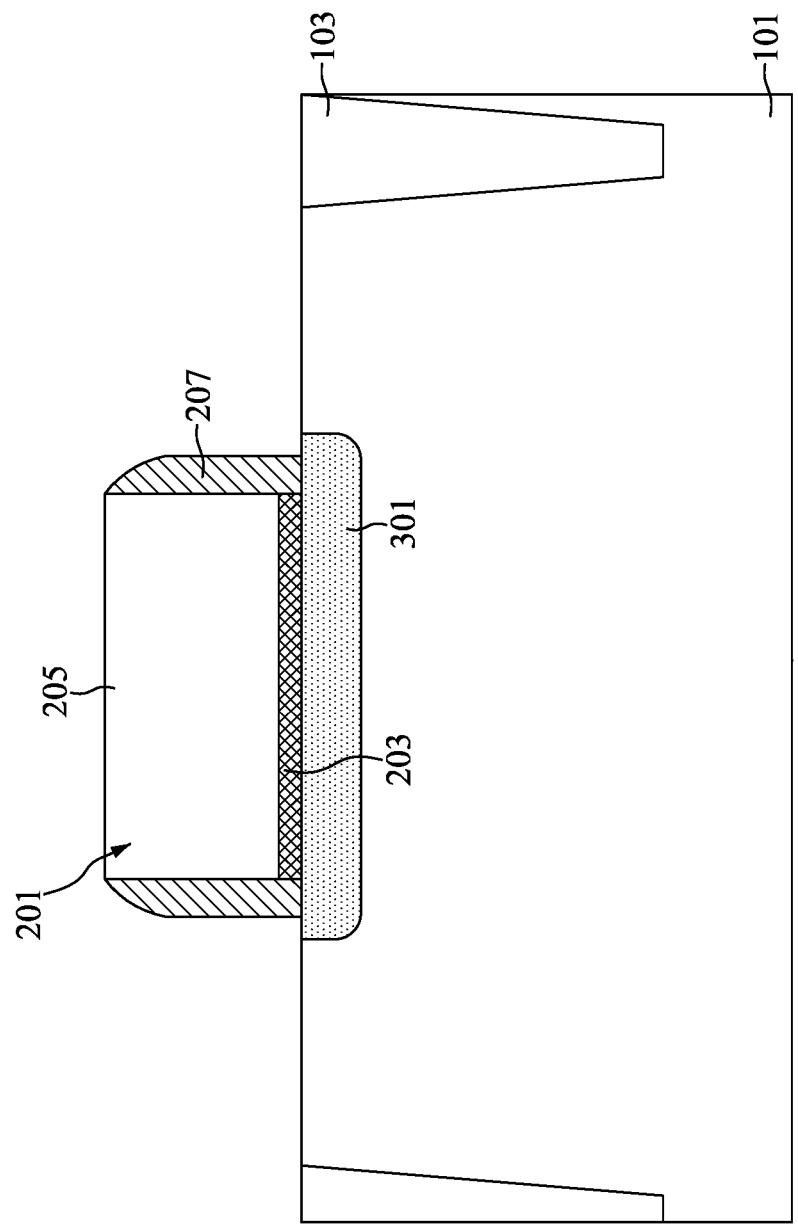

With reference to FIGS. 8 and 11, at step S15, first gate spacers 207 may be formed on sidewalls of the gate structure 201.

With reference to FIG. 11, a layer of insulating material may be conformally deposited to cover the substrate 101 and the gate structure 201. An etch process, such as an anisotropic dry etch process, may be subsequently performed to remove a portion of the layer of insulating material and concurrently form the first gate spacers 207 on sidewalls of the gate bottom conductive layer 205 and sidewalls of the gate dielectric layer 203. The layer of insulating material may be, for example, silicon oxide, silicon nitride, or the like. It should be noted that, there are still portions of the channel region 301 are exposed after the formation of the first gate spacers 207.

Figure 12:
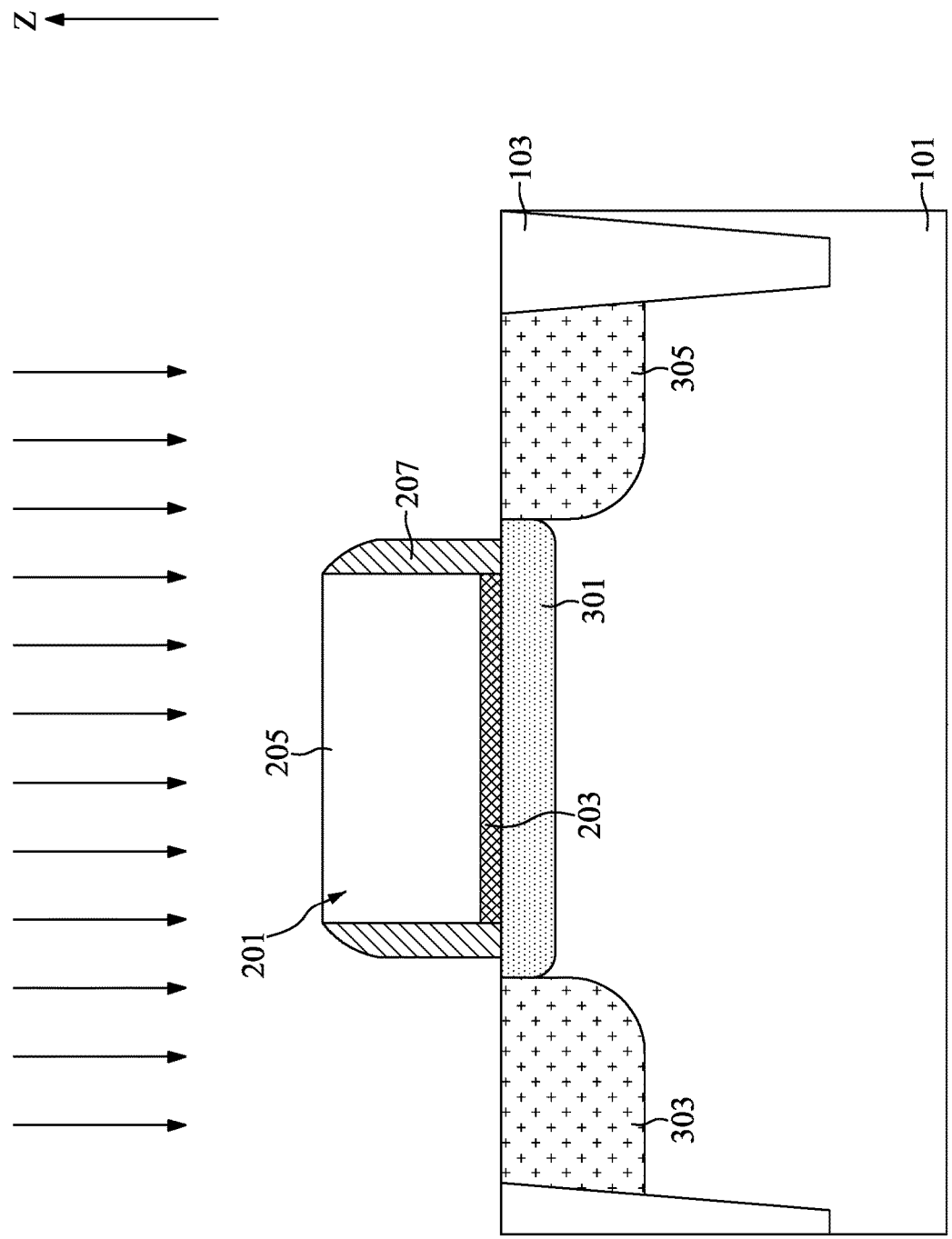

With reference to FIGS. 8 and 12, at step S17, first impurity regions 303, 305 may be formed in the substrate 101.

With reference to FIG. 12, an implantation process may be performed to form the first impurity regions 303, 305 in the substrate 101. The first impurity regions 303, 305 may be formed overlapping two ends of the channel region 301. The first impurity regions 303, 305 and the channel region 301 may be electrically connected.

Figure 13:
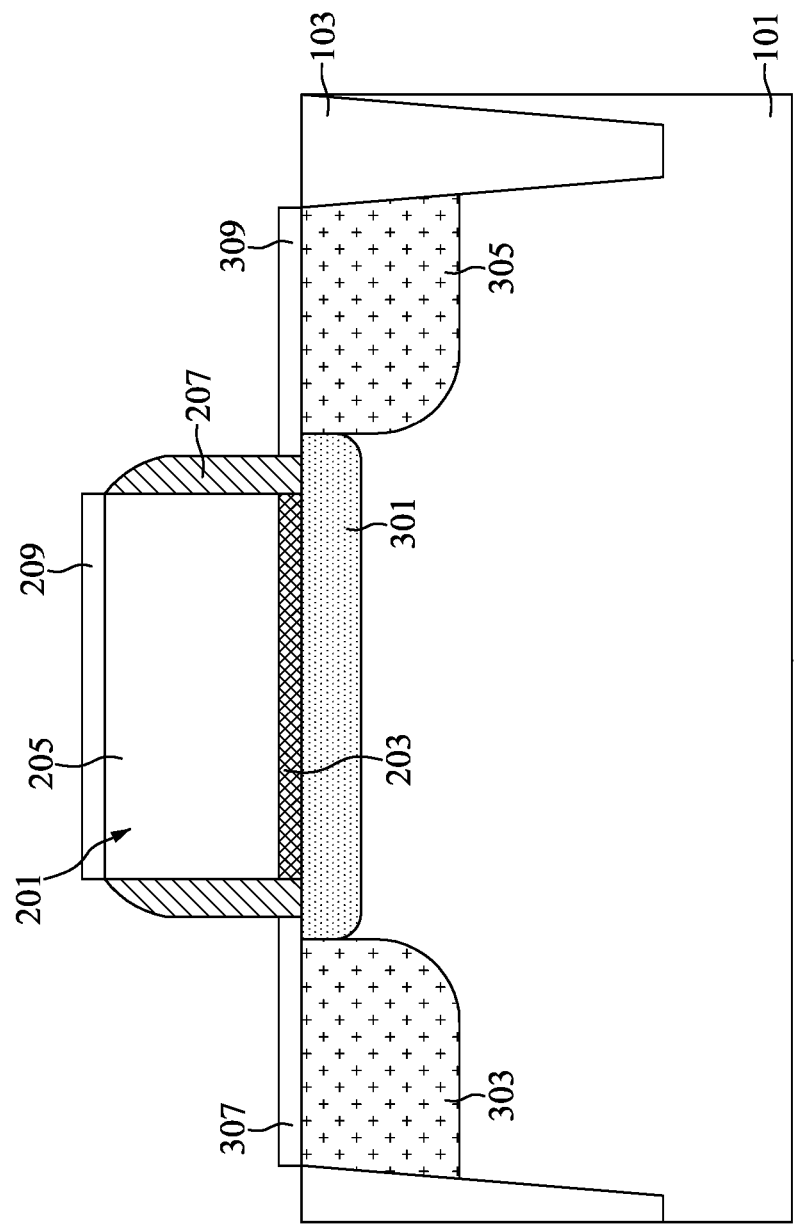

With reference to FIGS. 8 and 13, at step S19, a gate top conductive layer 209 may be formed on the gate structure 201 and first conductive layers 307, 309 may be respectively correspondingly formed on the first impurity regions 303, 305.

With reference to FIG. 13, a layer of conductive material may be formed over the substrate 101, the first gate spacers 207, and the gate bottom conductive layer 205. The layer of conductive material may include, for example, titanium, nickel, platinum, tantalum, or cobalt. A thermal treatment may be subsequently performed. During the thermal treatment, metal atoms of the metal layer may react chemically with silicon atoms of gate bottom conductive layer 205 to form the gate top conductive layer 209 and the first conductive layers 307, 309. The gate top conductive layer 209 and the first conductive layers 307, 309 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution.

Figure 14:
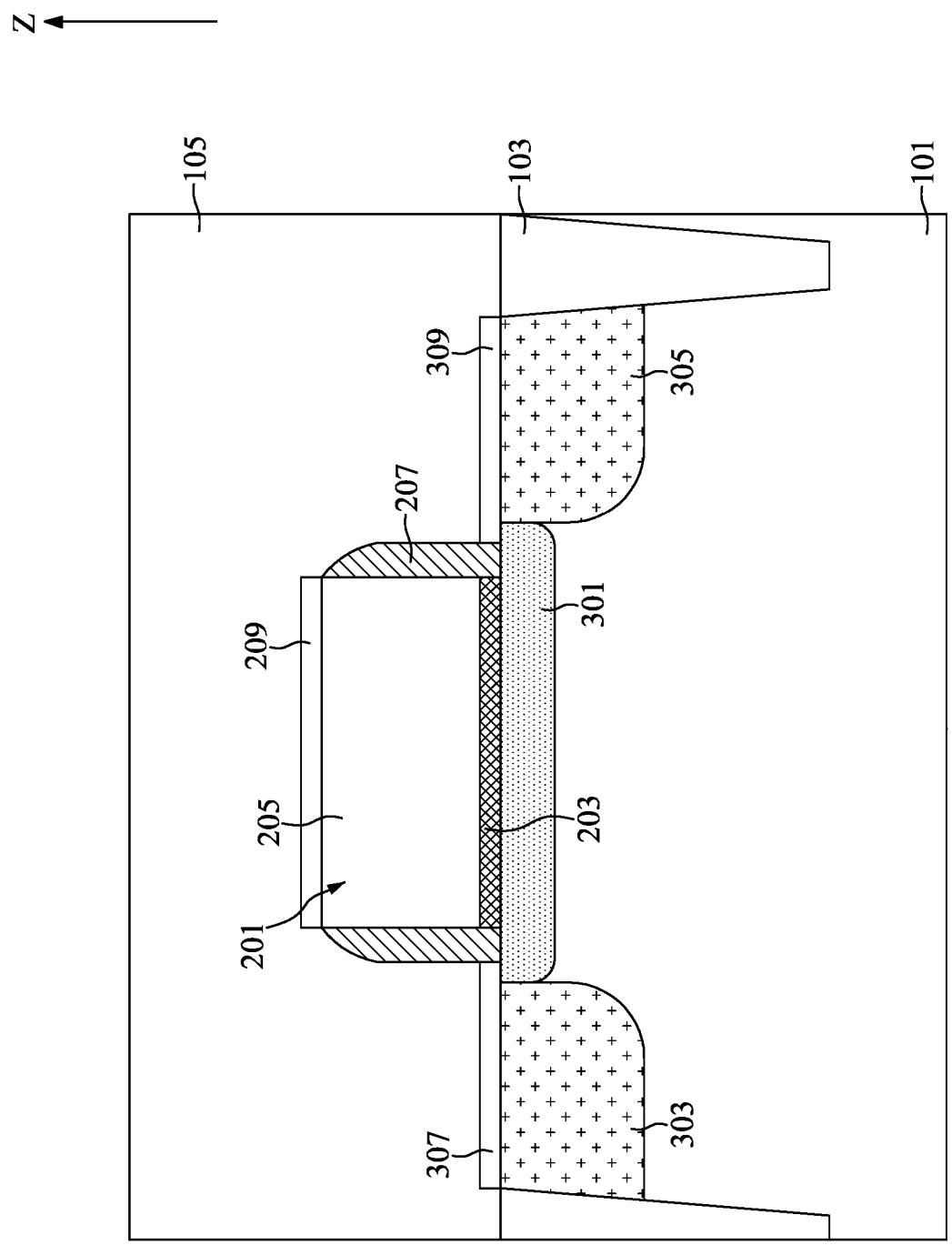
Figure 15:
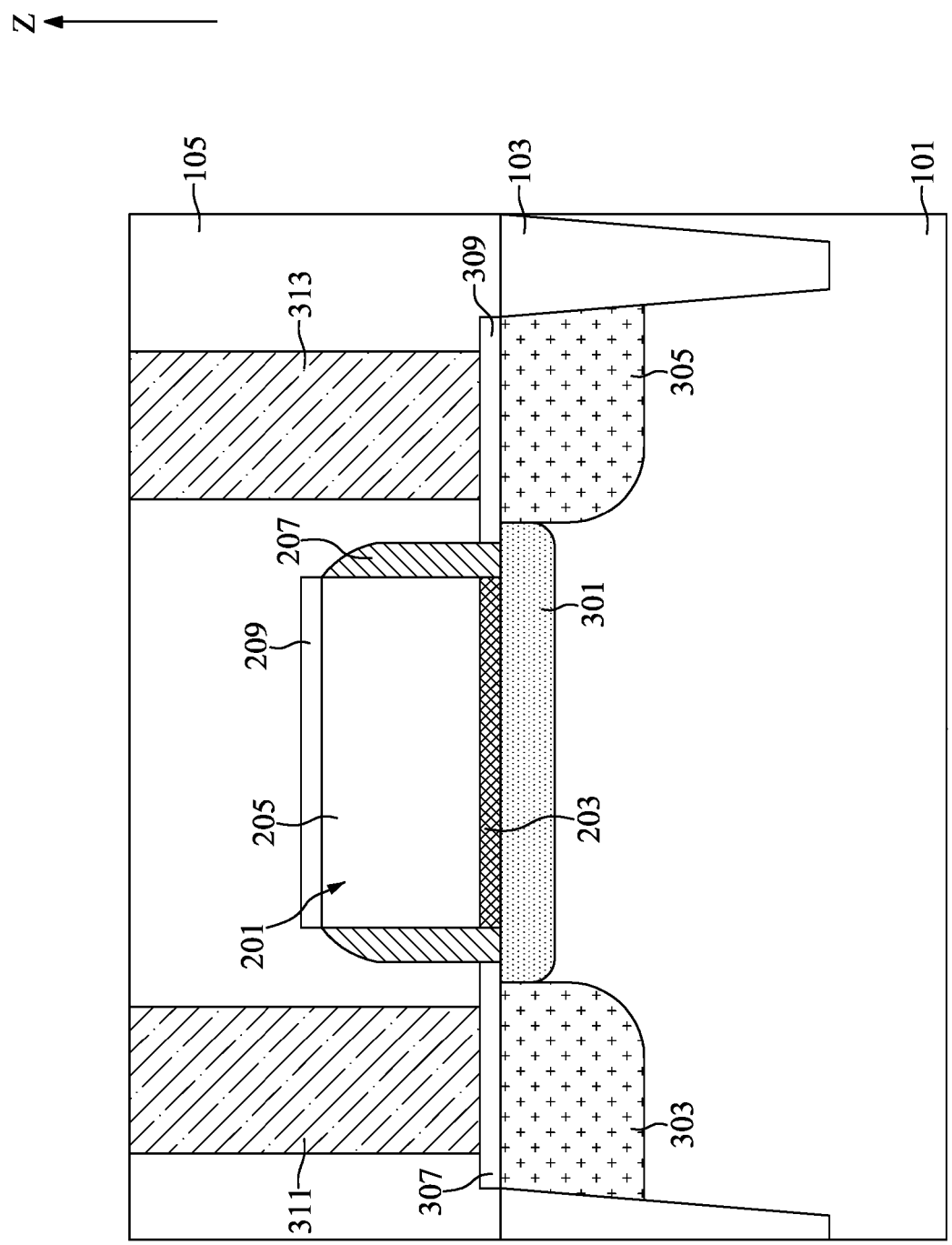

With reference to FIGS. 8, 14, and 15, at step S21, a first insulating layer 105 may be formed on the substrate 101 and first contacts 311, 313 may be formed on the first conductive layers 307, 309.

With reference to FIG. 14, the first insulating layer 105 may be formed over the intermediate semiconductor device illustrated in FIG. 13. A planarization process, such as chemical mechanical polishing, may be performed to provide a substantially flat surface for subsequent processing steps.

With reference to FIG. 15, a photolithography process may be performed to define the positions of the first contacts 311, 313. An etch process, such as an anisotropic dry etch process, may be performed to form contact openings in the first insulating layer 105. The top surfaces of the first conductive layers 307, 309 may be exposed through the contact openings. A conductive material such as tungsten, cobalt, zirconium, tantalum, titanium, aluminum, ruthenium, copper, metal carbides, metal nitrides, or transition metal aluminides may be deposited into the contact openings by a deposition process. After the deposition process, a planarization process, such as chemical mechanical polishing, may be performed to remove excess material, provide a substantially flat surface for subsequent processing steps, and conformally form the first contacts 311, 313.

Figure 16:
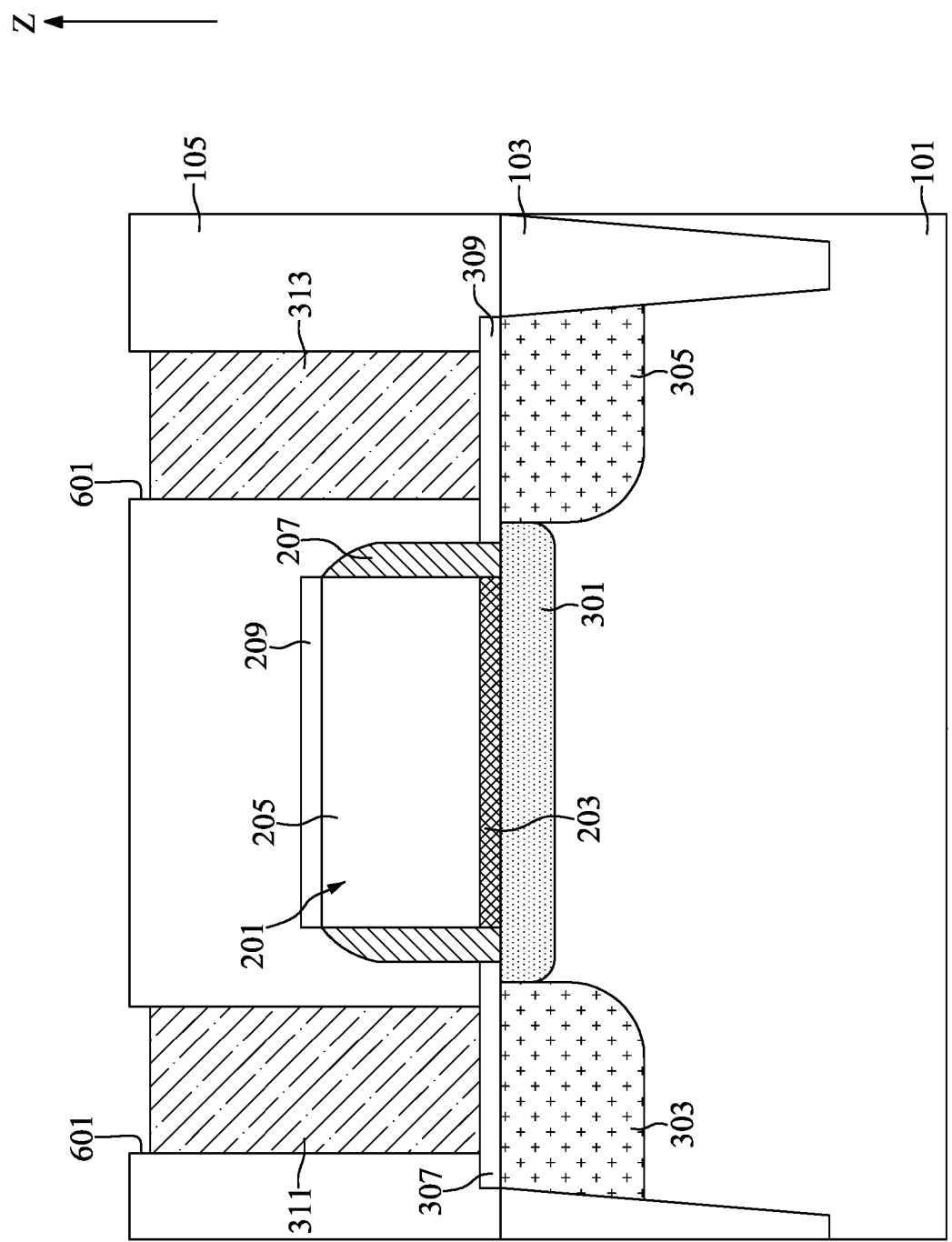
Figure 17:
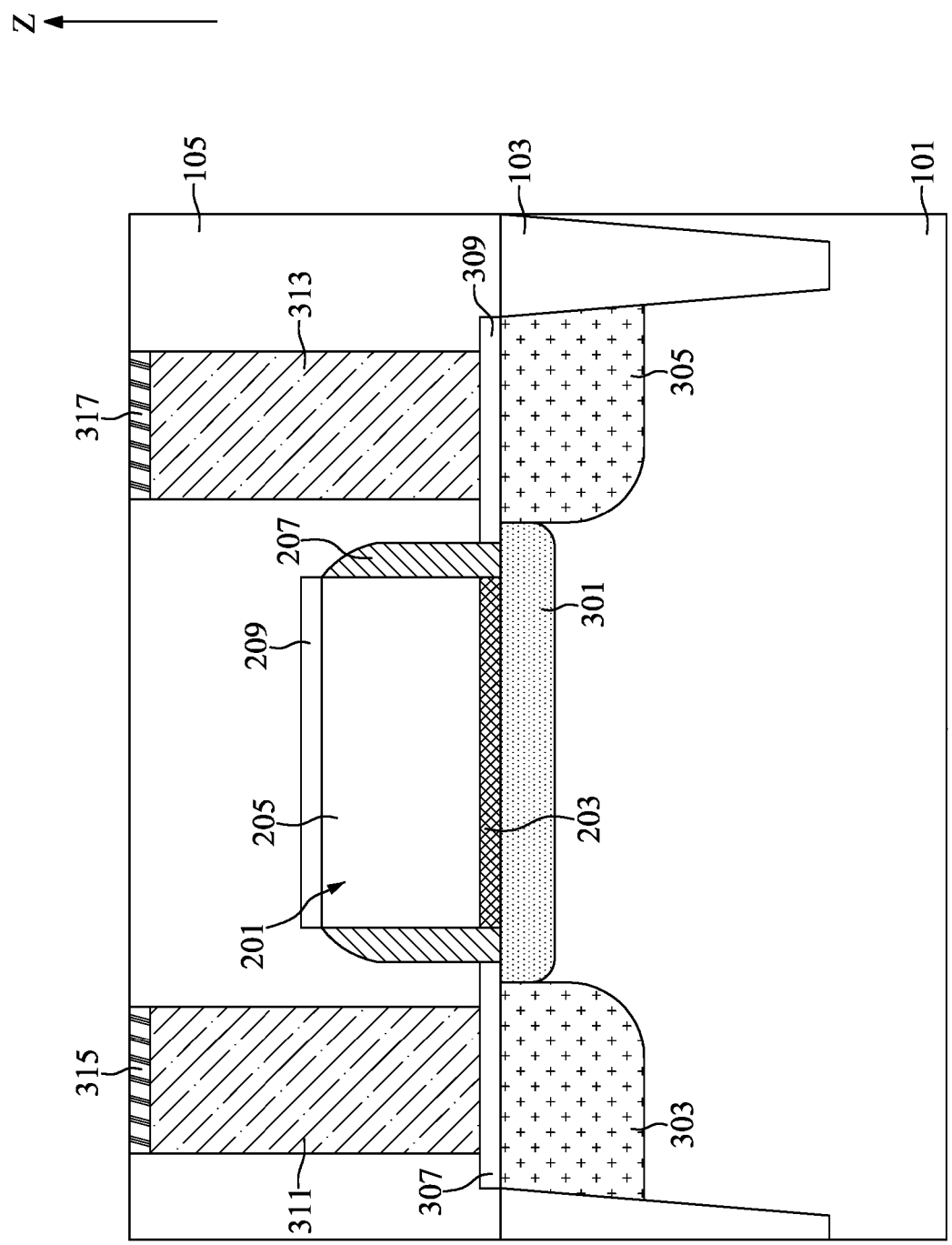

With reference to FIGS. 8, 16, and 17, at step S23, programmable insulating layers 315, 317 may be respectively correspondingly formed on the first contacts 311, 313.

With reference to FIG. 16, an etch back process may be performed to recess the first contacts 311, 313 and concurrently form recesses 601. During the etch back process, an etch rate ratio of the first contacts 311, 313 to the first insulating layer 105 may be between about 100:1 and about 20:1.

With reference to FIG. 17, an insulating material may be deposited to fill the recesses 601. A planarization process, such as chemical mechanical polishing, may be performed until the top surface of the first insulating layer 105 is exposed to provide a substantially flat surface for subsequent processing steps. The insulating material may be, for example, silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof.

Figure 18:
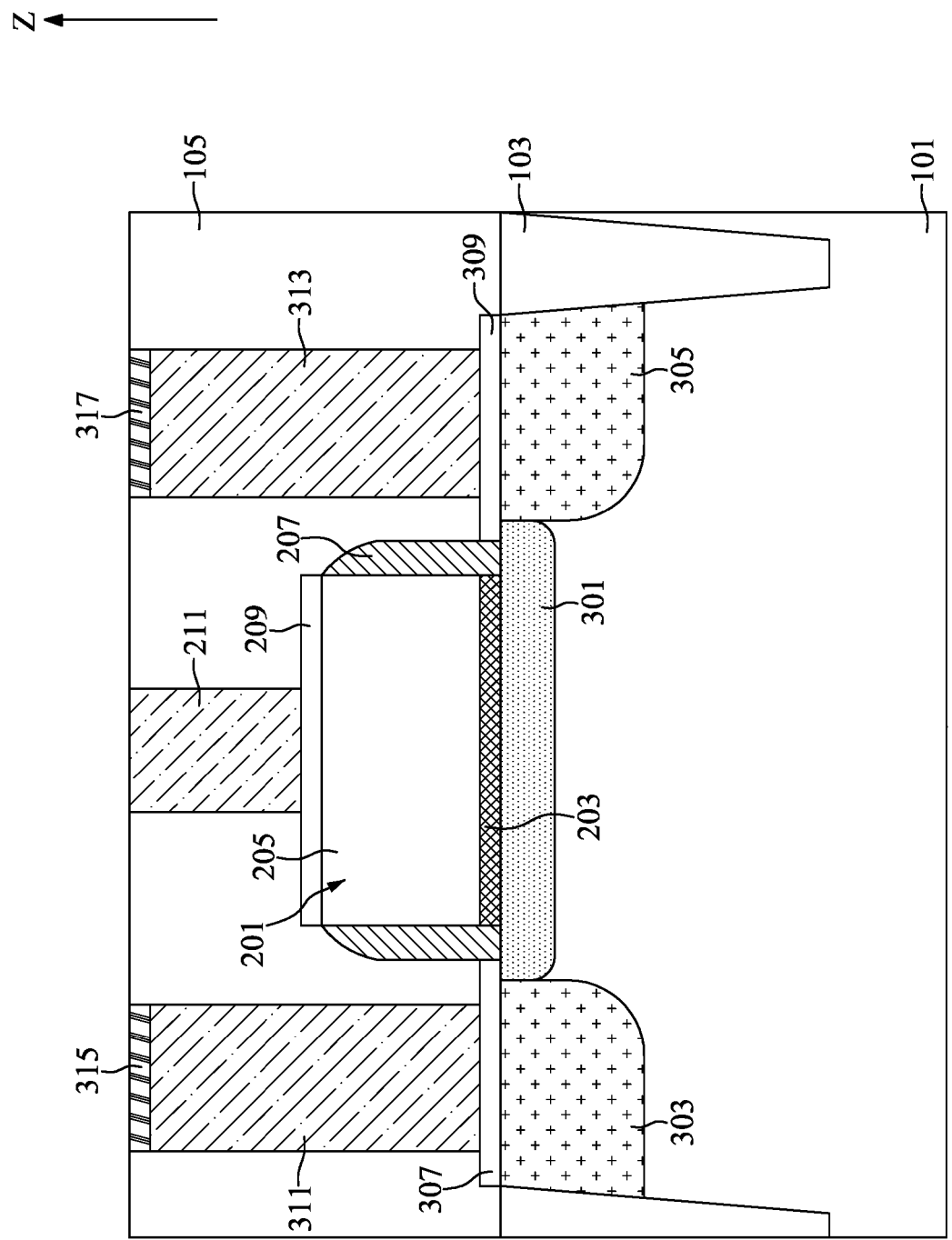

With reference to FIGS. 8 and 18, at step S25, a gate via 211 may be formed on the gate top conductive layer 209.

With reference to FIG. 18, a photolithography process may be performed to define the position of the gate via 211. An etch process, such as an anisotropic dry etch process, may be performed to form a via opening in the first insulating layer 105. The top surface of the gate top conductive layer 209 may be exposed through the via opening. A conductive material such as tungsten, cobalt, zirconium, tantalum, titanium, aluminum, ruthenium, copper, metal carbides, metal nitrides, or transition metal aluminides may be deposited into the via opening by a deposition process. After the deposition process, a planarization process, such as chemical mechanical polishing, may be performed to remove excess material, provide a substantially flat surface for subsequent processing steps, and conformally form the gate via 211.

Figure 19:
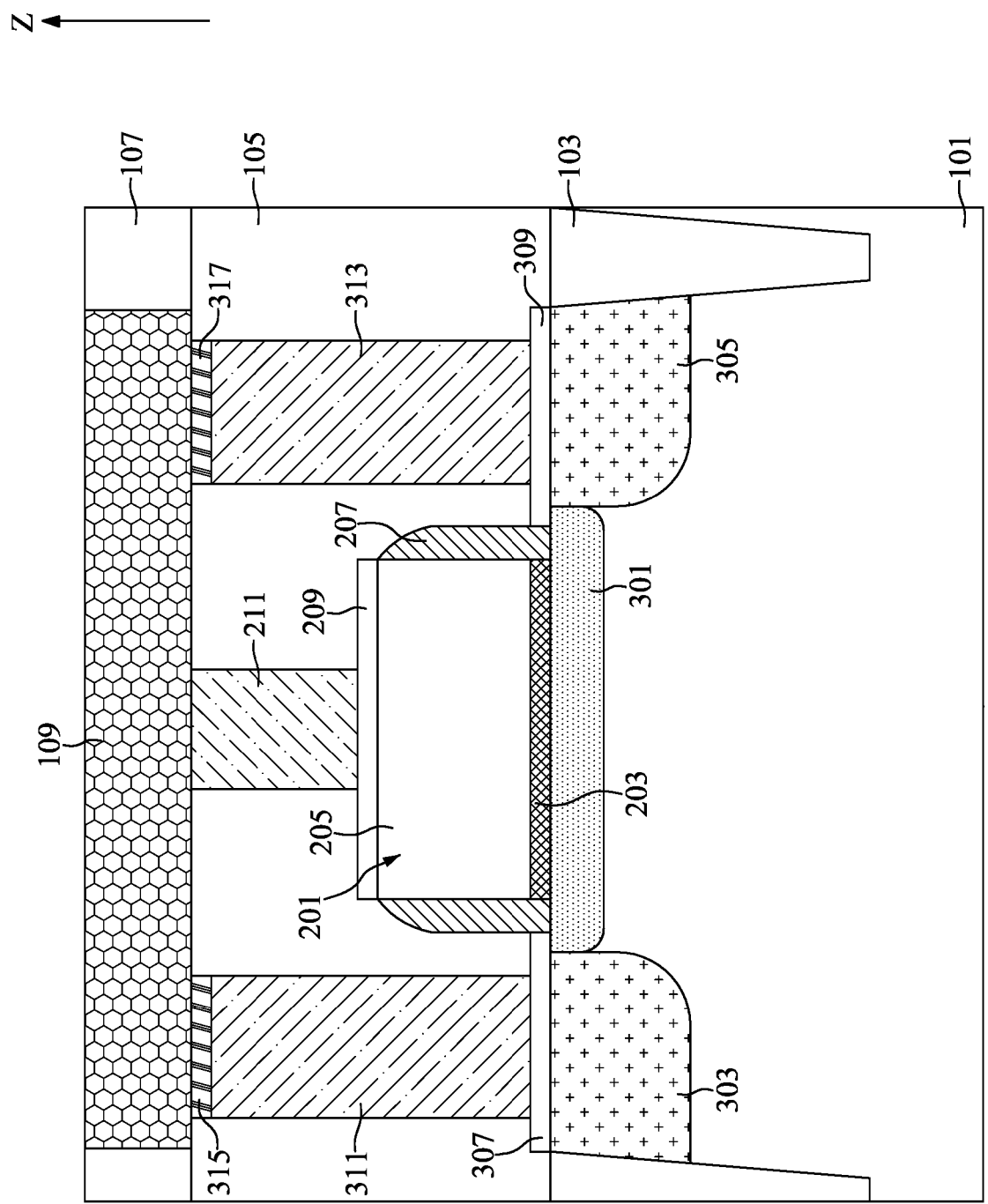

With reference to FIGS. 8 and 19, at step S27, a second insulating layer 107 may be formed on the first insulating layer 105 and a top conductive layer 109 may be formed in the second insulating layer 107.

With reference to FIG. 19, the second insulating layer 107 may be formed over the intermediate semiconductor device illustrated in FIG. 18. A first planarization process, such as chemical mechanical polishing, may be performed to provide a substantially flat surface for subsequent processing steps. A photolithography process may be performed to define the position of the top conductive layer 109. An etch process, such as an anisotropic dry etch process, may be performed to form a trench in the second insulating layer 107. The top surfaces of the gate via 211 and the programmable insulating layers 315, 317 may be exposed through the trench. A conductive material such as tungsten, cobalt, zirconium, tantalum, titanium, aluminum, ruthenium, copper, metal carbides, metal nitrides, or transition metal aluminides may be deposited into the trench by a deposition process. After the deposition process, a second planarization process, such as chemical mechanical polishing, may be performed to remove excess material, provide a substantially flat surface for subsequent processing steps, and conformally form the top conductive layer 109.

One aspect of the present disclosure provides a semiconductor device including a substrate, a channel region positioned in the substrate, first impurity regions positioned in the substrate and respectively positioned on two ends of the channel region, a gate dielectric layer positioned on the channel region, a gate bottom conductive layer positioned on the gate dielectric layer, first contacts respectively positioned on the first impurity regions, programmable insulating layers respectively positioned on the first contacts, a top conductive layer positioned on the programmable insulating layers and electrically coupled to the gate bottom conductive layer.

Another aspect of the present disclosure provides a semiconductor device including a substrate, a channel region positioned in the substrate, first impurity regions positioned in the substrate and respectively positioned on two ends of the channel region, a gate dielectric layer positioned on the channel region, a gate bottom conductive layer positioned on the gate dielectric layer, a gate via positioned on the gate bottom conductive layer, first contacts respectively positioned on the first impurity regions, programmable insulating layers respectively positioned on the first contacts, top conductive layers respectively positioned on the programmable insulating layers and the gate via.

Another aspect of the present disclosure provides a method for fabricating a semiconductor device including providing a substrate, forming a channel region in the substrate, forming a gate dielectric layer on the channel region, forming a gate bottom conductive layer on the gate dielectric layer, forming first impurity regions on two ends of the channel region, forming first contacts on the first impurity regions, forming programmable insulating layers on the first contacts, forming a gate via on the gate bottom conductive layer, and forming a top conductive layer on the gate via and the programmable insulating layers.

Due to the design of the semiconductor device of the present disclosure, the gate dielectric layer 203 and/or the programmable insulating layers 315, 317 may be rupture when a programming voltage is applied. Therefore, the semiconductor device 1A may serve as a programmable element and may be used in a repair system of a chip to improve the yield of the chip. In addition, with the presence of the peak portion 111, the reliability of programming the semiconductor device 1D may be improved.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising the steps of:
   (a) providing a substrate defining a channel region therein;
   (b) forming a gate bottom conductive layer above the channel region of the substrate and forming first impurity regions positioned in the substrate and respectively positioned on two ends of the channel region;
   (c) disposing at least two first contacts on the first impurity regions of the substrate, wherein the first contacts are spaced apart from each other;
   (d) forming programmable insulating layers on the first contacts respectively and are adapted to be ruptured when a programming voltage is applied during a programming procedure of the semiconductor device, wherein the programmable insulating layers are made of a material selected from a group consisting of silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, and a combination thereof;
   (e) forming a gate via on the gate bottom conductive layer; and
   (f) forming a top conductive layer on the gate via and the programmable insulating layers.

2. The method for fabricating the semiconductor device of claim 1, wherein the step (b) further comprises the steps of:
   disposing a gate dielectric layer on the channel region; and
   disposing the gate bottom conductive layer on the gate dielectric layer.

3. The method for fabricating the semiconductor device of claim 2, wherein the step (b) further comprises a step of forming first gate spacers on sidewalls of the gate bottom conductive layer and sidewalls of the gate dielectric layer.

4. The method for fabricating the semiconductor device of claim 3, wherein the step (e) further comprises the steps of:
   forming a gate top conductive layer between the gate via and the gate bottom conductive layer; and
   electrically coupling the top conductive layer with the gate top conductive layer through the gate via.

5. The method for fabricating the semiconductor device of claim 4, wherein the gate top conductive layer is formed of titanium silicide, nickel silicide, nickel platinum silicide, tantalum silicide, or cobalt silicide.

6. The method for fabricating the semiconductor device of claim 5, wherein a dopant concentration of the channel region is less than a dopant concentration of the first impurity regions.

7. The method for fabricating the semiconductor device of claim 6, wherein the channel region and the substrate have different electrical types.

8. The method for fabricating the semiconductor device of claim 4, further comprising the steps of:
   defining first impurity regions on two ends of the channel region, wherein at least one of the first contacts is formed on one of the first impurity regions; and
   providing a covering layer to cover the first impurity regions, the first gate spacers, and the gate top conductive layer, wherein the first contacts are respectively positioned along the covering layer and respectively positioned on the first impurity regions and the gate via is positioned along the covering layer and positioned on the gate top conductive layer.

9. The method for fabricating the semiconductor device of claim 8, further comprising a step of:
   a second impurity region positioned in the substrate and distant from the first impurity regions, wherein the second impurity region has a different electrical type from the first impurity regions and one of the first contacts is electrically coupled to the second impurity region.

10. The method for fabricating the semiconductor device of claim 9, wherein the gate dielectric layer has a same thickness as the programmable insulating layers.

11. The method for fabricating the semiconductor device of claim 9, wherein thickness of the programmable insulating layers are different from a thickness of the gate dielectric layer.

* * * * *